(12) United States Patent
Hirooka

(10) Patent No.: US 8,530,353 B2
(45) Date of Patent: Sep. 10, 2013

(54) SIC SUBSTRATE AND METHOD OF MANUFACTURING THE SAME

(75) Inventor: Taisuke Hirooka, Kobe (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 13/152,524

(22) Filed: Jun. 3, 2011

(65) Prior Publication Data

US 2011/0237078 A1 Sep. 29, 2011

Related U.S. Application Data

(63) Continuation of application No. 10/702,806, filed on Nov. 6, 2003, now abandoned.

(30) Foreign Application Priority Data

Nov. 8, 2002 (JP) .................................. 2002-325414

(51) Int. Cl.
- *H01L 21/302* (2006.01)
- *H01L 21/461* (2006.01)
- *C03C 25/68* (2006.01)
- *C03C 15/00* (2006.01)

(52) U.S. Cl.
USPC ............... 438/690; 216/58; 216/88; 438/959; 438/974

(58) Field of Classification Search
USPC .................................... 216/88; 438/690, 691
See application file for complete search history.

(56) References Cited

U.S. PATENT DOCUMENTS

| | | | | |
|---|---|---|---|---|
| 3,956,032 A | * | 5/1976 | Powell et al. | 117/101 |
| 4,946,547 A | * | 8/1990 | Palmour et al. | 117/97 |
| 5,750,434 A | * | 5/1998 | Urushidani et al. | 438/478 |
| 6,740,247 B1 | * | 5/2004 | Han et al. | 216/73 |
| 2003/0085409 A1 | * | 5/2003 | Shen et al. | 257/79 |
| 2004/0134418 A1 | * | 7/2004 | Hirooka | 117/101 |

FOREIGN PATENT DOCUMENTS

WO        WO 0124240 A1   *   4/2001

OTHER PUBLICATIONS

Quian et al. "Characterization of polishing-related surface damage in (0001) silicon carbide substrates" Dec. 12, 1995; J. Electrochem Soc vol. 142 No. 12; p. 4290-4294.*
Ling "Low-damage grinding/polishing of silicon carbide surfaces" 2001 SIMTech Technical Report (PT/01/001/PM).*
Padiyath et al. "Reactive ion etching of monocrystalline, polycrystalline, and amorpohous silicon carbide in CF4/O2 mixtures" Mar. 11, 1991 Applied Physics Letters 58(10) p. 1053-1055.*
Wolf and Tauber "Silcon processing for the VLSI era: vol. 1" 1986 Lattice Press, p. 546-547 and 618-619.*
Saddow et al. "Effects of substrate surface preparation on chemical vapor depostion growth of 4H-SiC epitaxial layers" Mar. 2001, J Electronic Materials, vol. 30 No. 3, p. 228-234.*

* cited by examiner

*Primary Examiner* — Allan Olsen
*Assistant Examiner* — Margaret D Klunk
(74) *Attorney, Agent, or Firm* — Keating & Bennett, LLP

(57) ABSTRACT

A method of manufacturing a SiC substrate which has a first principal surface and a second principal surface, includes the step of removing, by a vapor phase etching process, at least a portion of a work-affected layer which is formed by mechanical flattening or cutting on the first principal surface of the SiC substrate.

18 Claims, 5 Drawing Sheets

SIC SUBSTRATE AND METHOD OF MANUFACTURING THE SAME

BACKGROUND OF THE INVENTION

1. Field of the Invention

The present invention relates to a SiC (silicon carbide) substrate and a method of manufacturing the SiC substrate and, more particularly, to a method of manufacturing a SiC substrate in which at least one surface is polished.

2. Description of the Related Art

Recently, there has been a growing demand for lasers and light emitting diodes which use GaN-base semiconductors as light emitting layers and can emit light having a short wavelength, such as the ultraviolet region and blue color. These types of lasers and light emitting diodes are expected to be used as light sources for recording information at high recording densities on optical disks and reproducing information therefrom or light sources for displaying images in full color or for use in illumination. In general, it is difficult to cause a GaN-base semiconductor to grow into the shape of a large single crystal ingot having few crystal defects. For this reason, techniques for epitaxially growing a GaN-base semiconductor layer on a sapphire single crystal substrate or a SiC single crystal substrate are receiving attention and a sapphire single crystal substrate or a SiC single crystal substrate on which a GaN-base semiconductor layer is to be formed is sought after.

A SiC single crystal substrate is demanded also as a substrate for forming a high-quality SiC semiconductor layer. Because a SiC semiconductor has a wide band gap, a large dielectric breakdown electric field and a large thermal conductivity in comparison with a GaAs semiconductor, research and development have been carried out to form high-quality SiC semiconductor layers on a SiC single crystal substrate and to realize semiconductor elements operating at high temperatures and power semiconductor elements having a high breakdown voltage. In addition, in the semiconductor process, dummy wafers made of SiC are demanded because these wafers have excellent heat resistance, high thermal conductivity, high-temperature strength, low thermal expansion, wear resistance, etc.

A sapphire single crystal substrate or a SiC single crystal substrate for such applications is required to provide high working accuracy in the flatness of the substrate, the smoothness of the substrate surface, etc. However, generally a sapphire single crystal or SiC has high hardness and excellent corrosion resistance, and hence the workability of manufacturing such a substrate is bad and it is difficult to obtain a sapphire single crystal substrate and a SiC substrate having high working accuracy.

In particular, as described in Japanese Laid-Open Patent Publication No. 55-20262, when an ingot of sapphire single crystal is cut and lapped and its surface is then mirror finished, a work-affected layer in which work strains have been generated remains on the back surface, posing the problem that the substrate warps.

For this reason, when photolithography is performed on such a substrate, there arises some problems in that it becomes impossible to perform vacuum chucking of the substrate by an exposure device, etc., and that the accuracy of exposure worsens due to a poor flatness of the substrate, and so on. Furthermore, when a thin layer of metal, ceramics, etc. is formed on such a substrate in which a work-affected layer remains, the problem that the substrate breaks because of the addition of the stresses of the thin film to the residual stresses of the substrate arises.

For this reason, the Japanese Laid-Open Patent Publication No. 55-20262 discloses a technique which involves immersing a sapphire single crystal substrate in heated phosphoric acid or potassium hydroxide solution and removing a work-affected layer remaining in the substrate by dissolving the work-affected layer thereby to eliminate a warp of the substrate.

However, in the case of a SiC substrate, it is impossible to dissolve SiC with heated phosphoric acid or potassium hydroxide solution. Although fused alkalis which are heated to not less than 300° C. are known as solutions which dissolve SiC, large-scale equipment is necessary for safely handling high-temperature fused alkalis.

The Japanese Laid-Open Patent Publication No. 55-20262 discloses that ion sputtering and ion etching may also be adopted as other processes for removing the work-affected layer of a sapphire single crystal substrate. However, these processes involve performing the etching of a substrate surface by utilizing the physical energy of ions of argon, etc., which are accelerated by causing these ions to collide against the substrate surface. Thus, these processes have the problem that the etching rate is low.

Furthermore, because the melting point of SiC is not less than 2000° C., it is necessary to heat a SiC substrate to not less than 1600° C. in order to remove work strains by annealing. Large-scale equipment is necessary for subjecting the SiC substrate to heat treatment at such a high temperature.

SUMMARY OF THE INVENTION

In order to solve the problems described above, preferred embodiments of the present invention provide a method of manufacturing a SiC substrate in which a work-affected layer is removed under practical conditions.

According to a first preferred embodiment of the present invention, a method of manufacturing a SiC substrate which has a first principal surface and a second principal surface, includes the steps of forming a work-affected layer by mechanical flattening or cutting on the first principal surface of the SiC substrate, and removing, by a vapor phase etching process, at least a portion of the work-affected layer which is formed by mechanical flattening or cutting on the first principal surface of the SiC substrate.

It is preferable that the vapor phase etching process is a reactive ion etching process.

The second principal surface is preferably a surface where an element is to be formed.

According to another preferred embodiment of the present invention, the method described above further includes a step of mirror polishing the second principal surface.

According to another preferred embodiment of the present invention, in the method described above, the SiC substrate has a work-affected layer which is formed by mechanical flattening or cutting, on the second principal surface, and the method also includes the steps of removing at least a portion of the work-affected layer of the second principal surface by a vapor phase etching process, and mirror polishing at least the second principal surface after the steps of removing are performed.

In this method, the SiC substrate preferably has a work-affected layer which is formed by mechanical flattening or cutting, on the second principal surface, and the method further includes the step of removing the work-affected layer of the second principal surface by mechanical polishing and chemical mechanical polishing and mirror finishing the second principal surface.

In the methods described above, the first principal surface obtained by the step of removing preferably has a surface roughness of about 10 nm to about 1 μm.

In addition, the method described above also preferably includes a step of cutting the SiC substrate from an ingot of SiC and the first principal surface and second principal surface are formed by the step of cutting.

Also, in the step removing, the SiC substrate is preferably held so as to allow a change in the warp of the SiC substrate.

It is preferred that a gas containing fluorine is used in the vapor phase etching process. The gas containing fluorine is preferably $CF_4$ or $SF_6$.

In addition, in the vapor phase etching process described above, the work-affected layer is preferably removed at an etching rate in a range of about 0.5 μm/hr to about 20 μm/hr.

The SiC substrate is preferably one of amorphous, a poly crystal and a single crystal.

Yet another preferred embodiment of the present invention provides a SiC substrate manufactured according to a method including a step of removing, by a vapor phase etching process, at least a portion of a work-affected layer which is formed by mechanical flattening or cutting on the first principal surface of the SiC substrate.

An additional preferred embodiment of the present invention provides a SiC substrate including two substantially parallel principal surfaces, wherein only one of the two principal surfaces is mirror finished and the warp is not more than about ±50 μm.

Other features, elements, characteristics, steps and advantages of the present invention will become more apparent from the following detailed description of preferred embodiments with reference to the attached drawings.

DETAILED DESCRIPTION OF PREFERRED EMBODIMENTS

Figure 1:
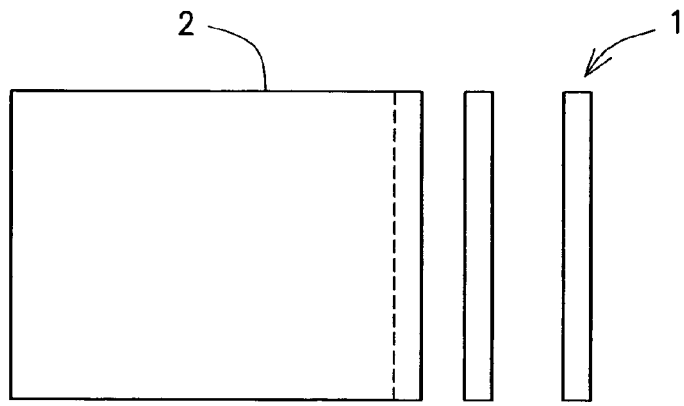
FIG. 1 is a schematic view showing how a substrate is cut from a SiC ingot.

In various preferred embodiments of the present invention, a work-affected layer formed on a SiC substrate by mechanical flattening or cutting is removed by a vapor phase etching process. In particular, it is preferable to use a reactive gas in the vapor phase etching process. For example, an ion etching process using a reactive gas or reactive ion etching (RIE) can be used in preferred embodiments of the present invention and it is more preferable to use reactive ion etching having high chemical reactivity.

In the field of manufacturing semiconductor devices, a method of removing thin films such as a semiconductor film and an insulating film by reactive ion etching has been known. In this field, however, reactive ion etching is used in the patterning and etching of thin films formed by use of a thin-film forming device or in the removal of oxide films on the surface of a semiconductor substrate, and the etched amount is typically not more than several hundreds of nanometers. Furthermore, it is known that when the reactive ion etching process is used, damage by a plasma is apt to occur in a semiconductor layer. For this reason, in a case where damage by a plasma poses a problem, it has been general practice to remove a semiconductor layer or an insulating layer by the wet etching process using an etching liquid or to remove a semiconductor region where damage by reactive ion etching has occurred due to reactive ion etching after the etching by the reactive etching process. That is, in a step where the use of wet etching is desirable, etching by reactive ion etching is often an inappropriate process.

In spite of this background, the present inventors discovered that a SiC substrate can be etched or lapped at a practical etching rate by vapor phase etching, preferably, by reactive ion etching using a gas including fluorine. The idea of lapping a SiC substrate, which is not a thin film, by vapor phase etching on the order of several microns has not been proposed or performed in the field of the manufacturing of semiconductor devices. Thus, one of the unique characteristics of the present invention is in removing a work-affected layer formed on a surface that is opposite to a surface on which a semiconductor element is to be formed by vapor phase etching. As will be described in detail below, even if warping occurs on a SiC substrate at this time, the work-affected layer can be etched almost uniformly from the surface and the warp of the SiC substrate is eliminated in association with the removal of the work-affected layer. Therefore, it is possible to manufacture a SiC substrate that has excellent parallelism and TTV (total thickness variation) of the substrate. According to preferred embodiments of the present invention, the warp of a SiC substrate having a diameter of not more than about 4 inches can be reduced to within about ±50 μm. No SiC substrate having such a small warp has been obtained by conventional manufacturing methods.

Furthermore, even when reactive ion etching is used to remove a work-affected layer formed on a SiC substrate, damage by reactive ion etching which occurs in the SiC substrate does not cause a problem. This is because a principal surface from which a work-affected layer is to be removed is a surface that is opposite to a surface which is to be mirror polished and on which a semiconductor element is to be formed. Alternatively, a principal surface from which a work-affected layer is to be removed is a surface which can be further subjected to mirror polishing after the removal of the work-affected layer by reactive ion etching.

The method of manufacturing a SiC substrate according to preferred embodiments of the present invention will be specifically described in the following. As shown in FIG. 1, a SiC substrate 1 used in preferred embodiments of the present invention is preferably a cut piece which is cut from an ingot 2 of SiC. The ingot 2 of SiC may be single crystal, polycrystal or amorphous. The ingot 2 of SiC may include additional elements such as Al, Zr, Y and O other than Si and C or substituent elements. It should be construed that in this specification, a SiC substrate includes a SiC substrate including SiC which may include additive elements or constituent elements.

The shape of the SiC substrate 1 is not especially limited and SiC Substrates/of various sizes, thicknesses and plane shapes can be used. For example, in a case where a SiC substrate 1 consisting of a single crystal is used as a substrate for the epitaxial growth of a GaN-base semiconductor layer, a disk-shaped SiC substrate 1 having a diameter of about 2 inches and a thickness of about 500 μm is preferably prepared.

Figure 2:
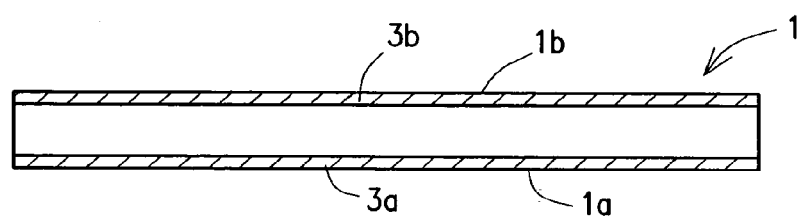
FIG. 2 is a sectional view showing work-affected layers formed in a substrate cut by machining.

For the cutting of the ingot 2 of SIC, it is possible to use a cutting blade, which is an outside peripheral cutting edge or an inside peripheral cutting edge, a wire saw, or other suitable device. The SiC substrate 1 cut by such cutting includes, as shown in FIG. 2, work-affected layers 3a, 3b in the vicinity of a first principal surface 1a and a second principal surface 1b formed by cutting. In this specification, cutting refers to the cutting by the cutting blade of the outside peripheral cutting edge or the inside peripheral cutting edge, the cutting by the wire saw described above, or other suitable cutting apparatus.

Work strains are caused in the work-affected layers 3a, 3b due to mechanical cutting. For this reason, compressive stresses which might make both the first principal surface 1a and the second principal surface 2b convex act on the work-affected layers 3a, 3b. The magnitude of compressive stresses depends on the thickness of the work-affected layers 3a, 3b. As is apparent from FIGS. 1 and 2, because the first principal surface 1a and second principal surface 2b of the SiC substrate 1 are formed by mechanical cutting under the same conditions, the thickness of the work-affected layer 3a and the work-affected layer 3b is substantially equal. For this reason, the compressive stresses acting on the work-affected layer 3a and the work-affected layer 3b become equal, with the result that scarcely any warp occurs in the SiC substrate 1 cut from the ingot 2 of SiC as a whole. Although the thickness of the work-affected layers 3a, 3b depends on cutting conditions, such as a cutting method, and the properties of a substrate, it is said that generally this thickness is about 3 to about 10 times the maximum surface roughness Rmax of a surface formed by cutting.

Figure 3A:
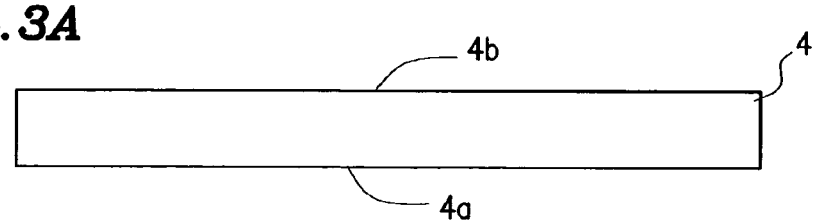
FIG. 3A shows a SiC sheet formed by sintering and FIGS. 3B and 3C each show a SiC substrate fabricated by a mechanical plane working from the SiC shown in FIG. 3A.
Figure 3B:
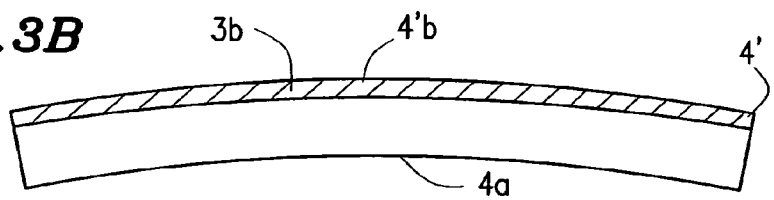

In FIGS. 1 and 2, the SIC substrate 1 cut from the ingot 2 of SiC was described. However, a SiC substrate used in various preferred embodiments of the present invention may be obtained by thinning a SiC sheet, which is formed by sintering. As shown in FIG. 3A, a SiC sheet 4 formed by sintering is prepared and subjected to mechanical flattening by polishing at least either of the first principal surface 4a and the second principal surface 4b by use of a lapping device or other suitable device. By performing mechanical flattening until the thickness of the SiC sheet 4 becomes a desired value, the SiC substrate 4' shown in FIG. 3B is obtained. In the SiC substrate 4', only its second principal surface 4'b is formed by mechanical polishing and a work-affected layer 3b is formed by mechanical polishing in the vicinity of the surface of the second principal surface 4'b. Because the first principal surface 4a is a surface of the SiC sheet 4 formed by sintering, no work-affected layer 3b is formed on the first principal surface 4a. For this reason, in the SiC substrate 4', the second principal surface 4'b is warped to provide a convex state under compressive stresses due to the work-affected layer 3b.

In this specification, mechanical flattening refers to polishing by a lapping device by use of an abrasive, polishing by a vertical grinder, or other suitable apparatus. In a case where a work-affected layer is present in the vicinity of the surface of a principal surface of a substrate, the work-affected layer is removed by polishing the substrate by mechanical flattening. However, work strains are always generated in a region near the surface of a principal surface of the substrate and a new work-affected layer is formed. As a result, a work-affected layer is always present on a principal surface of the substrate subjected to mechanical flattening. As described above, the thickness of this work-affected layer depends on the maximum surface roughness Rmax of the surface. A surface polished by mechanical flattening has a surface roughness Ra of about 10 nm to about 1 μm.

Figure 3C:
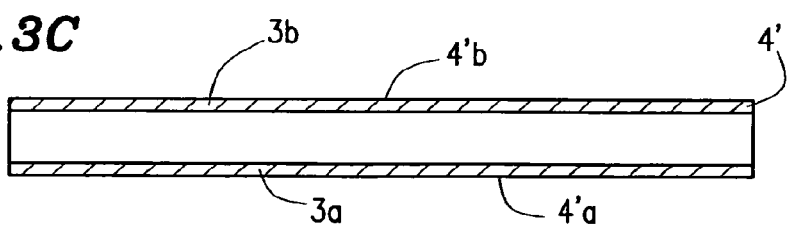

As shown in FIG. 3C, in a case where the first principal surface 4a and second principal surface 4b of the SiC sheet 4 are mechanically polished, the SiC substrate 4' in which the work-affected layers 3a, 3b are formed on the first principal surface 4'a and the second principal surface 4'b is obtained. As described above, the thickness of the work-affected layer 3b depends on the maximum surface roughness Rmax of the first principal surface 4'a and the second principal surface 4'b. For this reason, regardless of the polished amount of the first principal surface 4a and second principal surface 4b, the thickness of the work-affected layer 3a and work-affected layer 3b becomes almost equal. Generated compressive stresses are almost equal on the side of the first principal surface 4'a and the side of the second principal surface 4'b, and scarcely any warp occurs in the SiC substrate 4' shown in FIG. 3C.

Next, the step of removing a work-affected layer 3 by the reactive ion etching process will be described. Various reactive ion etching devices used in the semiconductor manufacturing process, such as a parallel flat plate type reactive ion etching device, an ECR (Electron Cyclotron Resonance) reactive ion etching device and an ICP (Inductively Coupled Plasma) etching device can be used as the device used in the reactive ion etching process. It is desirable to use a gas including F in etching. Although it is possible to use $F_2$, $CF_4$, $CHF_3$, $CH_2F_2$, $CH_3F$, $SF_6$, etc., it is more preferred to use $CF_4$ or $SF_6$. A mixed gas obtained by adding other gasses such as Ar, $H_2$, $O_2$ and $N_2$ to a gas including F may be used.

The SiC substrate 1 is held in a substrate holder in such a manner that the work-affected layer 3 to be removed is exposed within a chamber of a reactive ion etching device. At this time, it is preferred that the whole of the SiC substrate 1 is not bonded and fixed to the substrate holder so that the substrate holder can hold the SiC substrate 1 by allowing a change in the warp even when the warp of the SiC substrate 1 changes during etching.

The magnitude of power to be input, the gas pressure during a reaction and the flow rate of a reactant gas depend on the type of a device to be used, the crystallization state of a SiC substrate to be etched and the number of SiC substrates to be introduced at a time. It is preferable to adjust these parameters so that the etching rate for the removal of a work-affected layer becomes about 0.5 μm/hr to about 20 μm/hr. When the etching rate is lower than about 0.5 μm/hr, the etching efficiency is low and there is a problem in the process capability. In a general reactive etching device, it is difficult to increase the etching rate to rates higher than about 20 μm/hr. Practically, it is more preferred to cut a work-affected layer at an etching rate of about 1 μm/hr to about 5 μm/hr.

By the reactive ion etching process, a work-affected layer of the SiC substrate 1 reacts chemically with the chemical species in an etching gas and becomes a gas, which is removed. By using reactive ion etching, a work-affected layer is removed with the surface condition that exists before etching being kept as it is. Therefore, the surface roughness of the substrate surface is substantially maintained before and after the reactive ion etching.

Because the removal of a work-affected layer by the reactive ion etching process proceeds by the contact of the surface of the work-affected layer with an etching gas, it proceeds substantially uniformly from the surface of the work-affected layer even when the SiC substrate 1 is warped and hence the thickness of the work-affected layer decreases uniformly as a whole. Stresses by work-affected layer decrease with decreasing thickness of the work-affected layer and the warp of the SiC substrate 1 is eliminated. When the SiC substrate 1 is flat before the removal of a work-affected layer due to the balance of stresses, the balance of stresses is lost by the removal of the work-affected layer and, therefore, conversely a warp occurs. Because at this time, the SiC substrate 1 is not bonded to the substrate holder of the reactive ion etching device, the SiC substrate 1 can be held according to a change in the warp.

That is, even if the SiC substrate is warped, by performing the removal of a work-affected layer by the reactive ion etching process, it is possible to remove the work-affected layer from the surface substantially uniformly and it is possible to hold the SiC substrate by allowing a change in the warp of the SiC substrate 1 which occurs in association with the removal of the work-affected layer. As a result of this, it is possible to eliminate the warp of the substrate and to simultaneously achieve high parallelism and small thickness variations. Incidentally, during reactive ion etching, the chemical species of an etching gas in a plasma state collide with the SiC substrate 1 and this may damage the surface of the SiC substrate 1. As described above, it has been considered that the damage to the substrate surface by such a plasma is undesirable. In preferred embodiments of the present invention, however, this damage does not pose a problem. This is because, as will be described below, a principal surface on which a work-affected layer to be removed by the reactive ion etching process is present is not the surface on which an epitaxial layer is caused to grow as the substrate and because the surface region of the SiC substrate in which damage occurs is to be removed later by the step of mirror polishing.

Thus, preferred embodiments of the present invention provide a unique advantage in that a work-affected layer is removed by reactive ion etching. And by combining the step of removing a work-affected layer by reactive ion etching with the step of polishing a SiC substrate, a SiC substrate having characteristics which previously have been incapable of being obtained can be fabricated.

As steps capable of being combined with the step of removing a work-affected layer in preferred embodiments of the present invention, the above-described mechanical flattening and mirror polishing can be used. As mirror polishing, it is possible to use chemical mechanical polishing (CMP) which is accompanied by chemical etching. Chemical mechanical polishing can remove a surface region of the substrate and reduce the surface roughness of the surface, with scarcely any new work strains being generated. For this reason, unlike mechanical flattening, a new work-affected layer is scarcely formed during chemical mechanical polishing and the thickness of a work-affected layer is very small even if it is formed. Therefore, the effect of compressive stresses by a work-affected layer are almost negligible. Furthermore, a surface subjected to chemical mechanical polishing becomes a mirror surface. A surface finished to a mirror state has a surface roughness Ra of not more than about 1 nm. Although generally colloidal silica is used in chemical mechanical polishing, other materials for chemical mechanical polishing may be used.

The method of manufacturing a SiC substrate according to preferred embodiments of the present invention will be described in further detail below. Incidentally, in each of the drawings of FIGS. 4A to 4D, FIGS. 7A to 7C and FIGS. 8A to 8C, finishing symbols are shown for the principal surfaces of the substrates in order to indicate the surface roughness.

First Preferred Embodiment

Figure 4A:
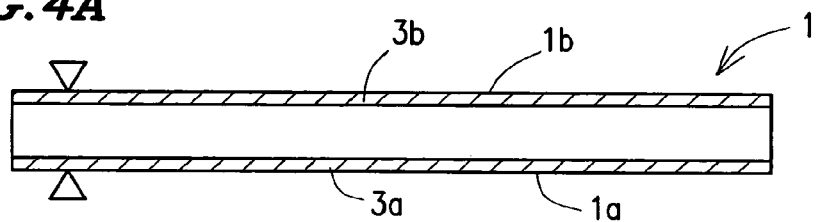
FIGS. 4A to 4D are each a sectional view to explain a method of fabricating a SiC substrate according to a first preferred embodiment of the present invention.

As shown in FIG. 4A, a SiC substrate 1 is prepared. As described by referring to FIGS. 1 and 2, the SiC substrate 1 is cut from an ingot 2 of SiC by cutting by use of a wire saw or other suitable cutting apparatus. Work-affected layers 3a and 3b are formed on a first primary surface 1a and a second primary surface 1b of the SiC substrate 1, respectively, by cutting.

Figure 4B:
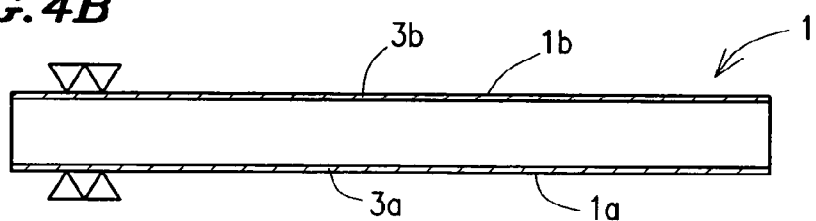

First, the first primary surface 1a and the second primary surface 1b are polished by use of an appropriate abrasive or lapping device so that the first primary surface 1a and the second primary surface 1b of the SiC substrate 1 obtain surface roughnesses that are smaller than the surface roughness obtained by cutting. As a result of this, as shown in FIG. 4B, a portion of the work-affected layers 3a, 3b of the first primary surface 1a and the second primary surface 1b is removed.

Figure 4C:
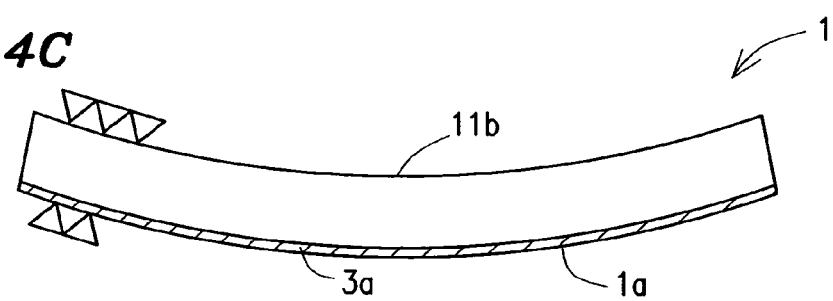

Next, by subjecting the second principal surface 1b in which the work-affected layers 3b remains to chemical mechanical polishing, the work-affected layers 3b are completely removed. The second principal surface 1b is a surface on which a semiconductor layer or other layers are to be formed later and a semiconductor element is to be formed. As a result of this, as shown in FIG. 4C, a second principal surface 11b finished to a mirror-polished state is formed. Because on the side of the first principal surface 1a the work-affected layer 3a remains as it is, the SiC substrate 1 is warped as a whole so that the first principal surface 1a becomes concave.

Next, the work-affected layer 3a remaining on a surface that is opposite to a surface on which a semiconductor element is to be formed is removed by reactive etching. Reactive etching is performed with the SiC substrate 1 held on a substrate holder within a reactive etching device so that the second principal surface 11b faces downward, whereby the work-affected layer 3a is completely removed. Because at this time the second principal surface 11b is in contact with the substrate holder, the second principal surface 11b is not etched in the least.

Figure 4D:
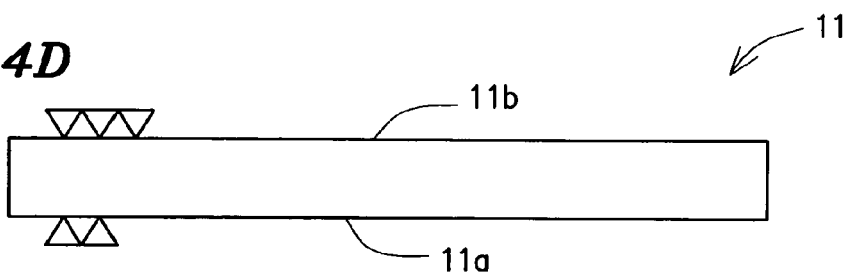

The warp of the SiC substrate 1 comes to be eliminated as the above-described work-affected layer 3a is uniformly removed as a whole, and the work-affected layer 3a is completely removed. Then, as shown in FIG. 4D, a substantially flat SiC substrate 11 with less warp is obtained. The surface roughness of the first principal surface is maintained before and after etching. For this reason, a first principal surface 11a which is formed after the removal of the work-affected layer 3a has a surface roughness of the same degree as the surface roughness by mechanical flattening. By lastly cleaning the SiC substrate 11, the flat SiC substrate 11 in which only one side is finished to a mirror state is obtained.

As described above, the first principal surface of the SiC substrate 11 has a surface roughness of a degree that can be obtained by mechanical flattening. More specifically, the surface roughness Ra of the first principal surface 11a is about 10 nm to about 1 μm. On the other hand, the second principal surface 11b is finished to a mirror-polished state and has surface roughness Ra of not more than about 1 nm. Furthermore, the flatness of the whole SiC substrate is within about ±20 μm in the case of a substrate having a diameter of about 2 inches. Although in this preferred embodiment the first principal surface is subjected to mechanical flattening, the first principal surface may be kept in an as-cut state depending on the application of the substrate.

A substrate in which only one surface is mirror finished in this manner according to this preferred embodiment has the advantage that, for example, in semiconductor manufacturing equipment, the identification of the front surface and back surface of a substrate can be easily performed and the advantage that because light scatters on a surface which is not mirror finished and hence light is not transmitted by this surface, exposure can be performed by use of an exposure device even when the substrate material is transparent to a light source.

According to the conventional techniques, it is very difficult to manufacture a SiC substrate in which only one surface is mirror finished. This is because it is necessary to perform chemical physical polishing in order to remove a work-affected layer and because surface roughness is necessarily reduced by chemical physical polishing. For this reason, a conventional SiC substrate in which only one surface is mirror finished inevitably has the work-affected layer on a surface that is opposite to the mirror finished surface, and the warp of the conventional SiC substrate due to the work-affected layer is not less than about 60 μm.

Figure 5:
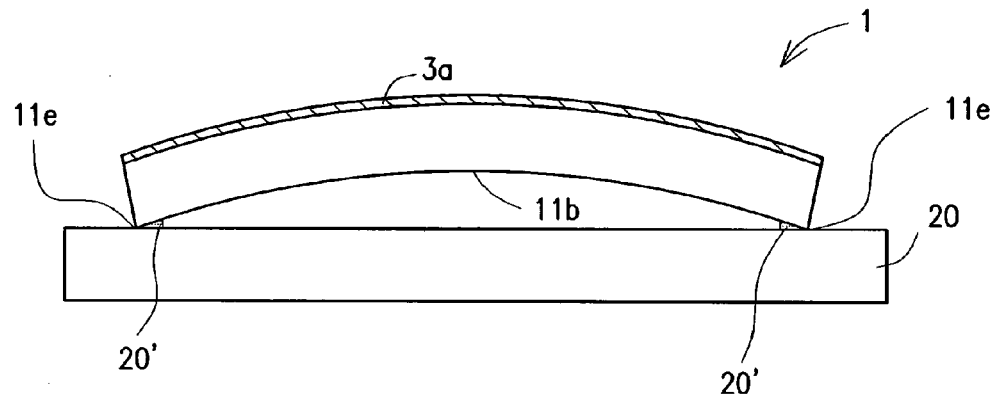
FIG. 5 is a sectional view showing the state of a SiC substrate held in a substrate holder of a reacting ion etching device.

Incidentally, in the step of reactive etching of this preferred embodiment, as shown in FIG. 5, the etching of a work-affected layer 3a is performed by holding a SiC substrate 1 so that a second primary surface 11b, which is the surface on which a semiconductor element is to be formed, is opposed to a substrate holder 20 of the reactive etching device. Because at this time the substrate holder 20 is also exposed to an etching gas, in some combinations of a gas which composes the substrate holder 20 and the etching gas, the substrate holder 20 may be etched and a contaminant 20', such as substances composing the etched substrate holder 20, may adhere to an area near an outer periphery 11e of the second primary surface 11b of the SiC substrate 1. Because the second primary surface 11b is the surface on which a semiconductor element is to be formed, it is undesirable that such a contaminant 20' should adhere to an area near the outer periphery 11e of the second primary surface 11b.

Therefore, when the contaminant 20' has adhered, it is desirable to remove the contaminant 20' after reactive etching. It is desirable to remove the contaminant 20' by wet etching by using a solution which does not substantially dissolve the SiC substrate 1, but dissolves the contaminant 20' so as not to etch the SiC substrate 1 or cause damage to the SiC substrate 1. That is, it is desirable to use an etching solution which does not substantially dissolve the SiC substrate 1 and to fabricate the substrate holder 20 from a material which is readily dissolved by this etching solution.

In this preferred embodiment, although the first principal surface 11a has surface roughness of such an extent that can be obtained by mechanical flattening, the first principal surface 11a may also be mirror finished by further performing chemical physical polishing. In this case, because there is no work-affected layer on the surface of the first principal surface 11a, the polishing time can be shortened compared to a case where polishing is performed by use of conventional techniques. Because no warp occurs in the SiC substrate 11, there is no fear of worsening of the parallelism and a warp of the SiC substrate 11 by mirror finishing.

In this preferred embodiment, it is not always necessary that the step of performing reactive etching be performed after the mirror finishing of the second principal surface 11b. For example, after the SiC substrate 1 is cut by cutting, first the work-affected layer 3a may be removed by reactive etching.

Second Preferred Embodiment

Figure 6A:
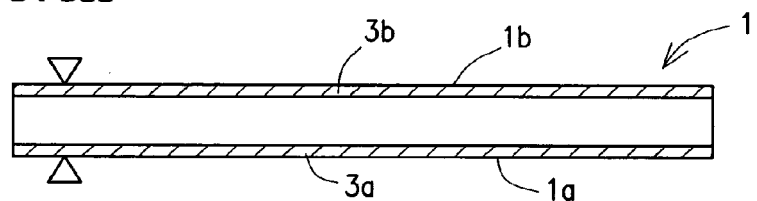
FIGS. 6A to 6C are each a sectional view to explain a method of fabricating a SiC substrate according to a second preferred embodiment of the present invention.

In the same manner as with the first preferred embodiment, a SiC substrate 1 is prepared as shown in FIG. 6A. Work-affected layers 3a and 3b are formed on a first primary surface 1a and a second primary surface 1b of the SiC substrate 1, respectively, by cutting or mechanical flattening.

Figure 6B:
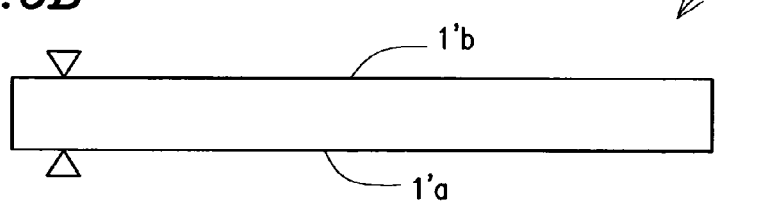

First, the work-affected layers 3a and 3b present on the first primary surface 1a and the second primary surface 1b are completely removed by reactive etching. For example, with the SiC substrate 1 held on a substrate holder within a reactive etching device so that the second principal surface 1b is opposed to the substrate holder so as to allow a change in the warp of the substrate, reactive etching is performed, whereby the work-affected layer 3a is completely removed. As described in the first preferred embodiment, the work-affected layer 3a is uniformly etched as a whole by reactive etching. Because a difference is produced in the thickness of the work-affected layers 3a and 3b as the thickness of the work-affected layer 3a decreases, a difference in stress is generated and a warp occurs in the SiC substrate 1 so that the second principal surface 1b becomes convex. Next, the SiC substrate 1 is reversed and the work-affected layer 3b is removed. The difference in stress decreases with decreasing thickness of the work-affected layer 3b and the warp of the substrate is removed. As a result of this, as shown in FIG. 6B, a SiC substrate 1' in which there is no work-affected layer in the first principal surface 1'a or the second principal surface 1'b is obtained. Because in the SiC substrate 1' there is no work-affected layer in the two principal surfaces, scarcely any warp occurs in the SiC substrate 1'.

Figure 6C:
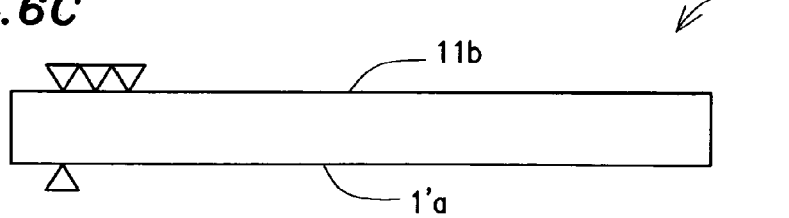

Next, the second principal surface 1'b is subjected to chemical mechanical polishing and finished to a mirror state. As a result of this, as shown in FIG. 6C, a SiC substrate 11 having a mirror-like second principal surface 11b is obtained. Because there is no remaining work-affected layer, no warp occurs in the SiC substrate 11 and in the case of a substrate having a diameter of about 2 inches, the flatness is within about ±20 μm.

Incidentally, as required, the surface roughness of the first principal surface 1'a may be reduced by performing the chemical mechanical polishing of the first principal surface 1'a. According to this preferred embodiment, although the first principal surface 1'a has a surface roughness which is large enough to be obtained by cutting or mechanical flattening, there is no work-affected layer. For this reason, the surface roughness of the first principal surface 1'a can be adjusted by performing chemical mechanical polishing which does not form a new work-affected layer for an arbitrary time.

Third Preferred Embodiment

Figure 7A:
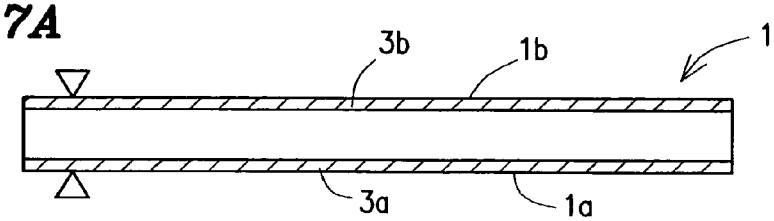
FIGS. 7A to 7C are each a sectional view to explain a method of fabricating a SiC substrate according to third preferred embodiment of the present invention.
Figure 7B:
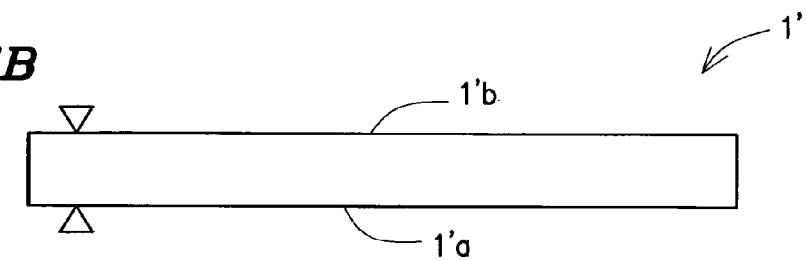
Figure 7C:
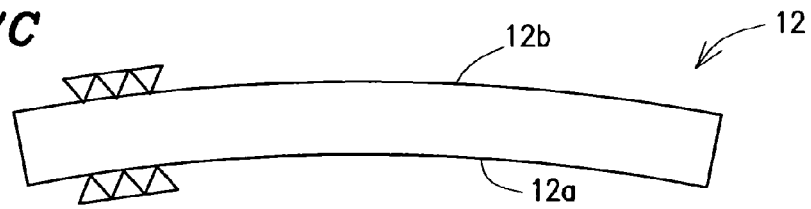

A SiC substrate 1 is prepared (FIG. 7A) by following a procedure similar to that of the second preferred embodiment, and work-affected layers 3a and 3b are removed by reactive etching. As a result of this, as shown in FIG. 7B, a SiC substrate 1' which is substantially flat and has no work-affected layer is prepared. A first principal surface 1'a and a second principal surface 1'b of the SiC substrate 1' have a surface roughness of such an extent that can be obtained by cutting.

Next, by use of a lapping device in which a bottom surface plate has a concave curved surface and a top surface plate has a convex curved surface, with the SiC substrate 1' held so that the second principal surface 1'b comes into contact with the bottom surface plate, the first principal surface 1'a and the second principal surface 1'b are simultaneously subjected to chemical mechanical polishing. As a result of this, a SiC substrate 12 has a second principal surface 12b that has convexity and a first principal surface 12a that has concavity. That is, the obtained SiC substrate 12 is curved in such a manner that the second principal surface 12b which is mirror finished is convex.

In this manner, usually a work-affected layer is not uniformly formed for a surface which is formed by mechanical flattening or cutting. Therefore, if the next process is performed with a work-affected layer kept present, it is difficult to control the shape of a substrate because of the presence of compressive stresses by the work-affected layer. According to the method of preferred embodiments of the present invention, however, because a work-affected layer is removed beforehand, flatness, parallelism, shape, and other characteristics and parameters can be freely controlled by appropriately selecting the shape of surface plates of a lapping device and the working method. For example, it is possible to fabricate a substrate which has a mirror finished convex surface and the surface that is opposite to this convex surface is flat like a satin finished surface, a substrate in which the front and back surfaces have a substantially parallel curved shape, a substrate in which the two surfaces are concave surfaces, etc.

Experimental Examples

In the first preferred embodiment as shown in FIG. 4C, for the SiC single crystal substrate 1 having the second principal surface 11b which is mirror finished, the work-affected layer 3a was etched by reactive ion etching from the side of the first principal surface 1a and the relationship between the etched amount and the parallelism of the SiC substrate 1 was investigated.

The second principal surface 11b of the SiC single crystal substrate 1 having a diameter of about 2 inches is mirror finished and its surface roughness Ra is not more than about 0.3 nm. The first principal surface 11a is worked to provide a satin finished surface and its surface roughness Ra is not more than about 0.3 µm.

A parallel flat plate type reactive ion etching device is used for etching and the input power during etching is about 1.0 W/cm$^2$. Etching was performed by introducing CF$_4$ as a reactive gas into a chamber at a flow rate of about 100 sccm and keeping the degree of vacuum at about $2.0 \times 10^{-3}$ torr. Parallelism was measured on the side of the second primary surface 11b.

Figure 8:
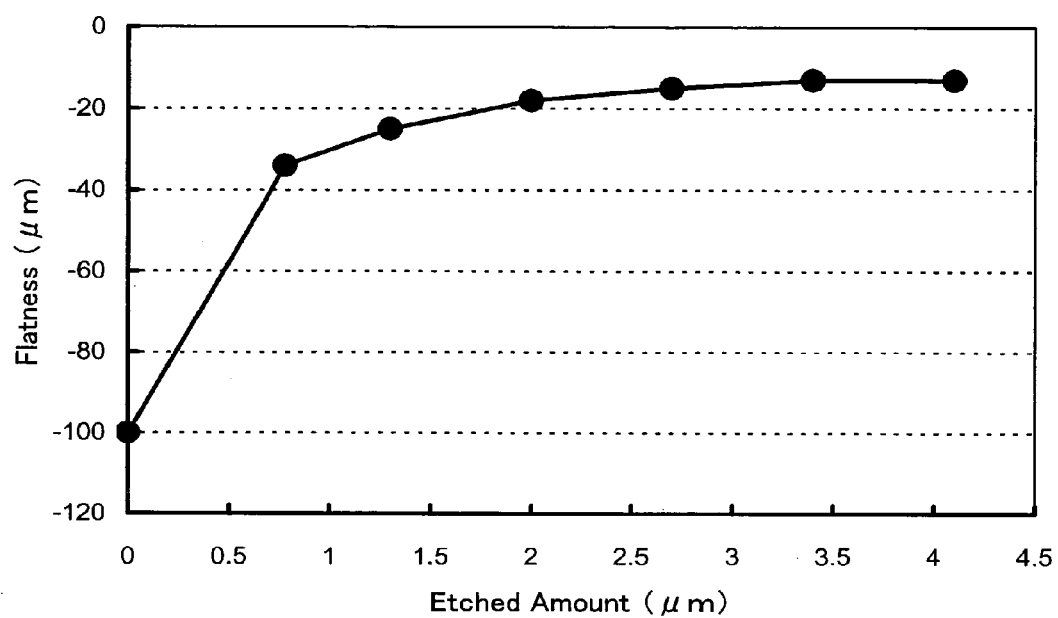
FIG. 8 is a graph showing the relationship between the etched amount by reactive etching and the flatness of a substrate.

FIG. 8 is a graph showing the relationship between the etched amount and the parallelism of the substrate. As shown in FIG. 8, the flatness of the SiC substrate is about −100 µm before etching (the etched amount: 0 µm). This shows that as shown in FIG. 4C, the SiC substrate 1 is warped so that the second principal surface 11b becomes concave.

As shown in FIG. 8, when the work-affected layer begins to be etched, flatness decreases abruptly. The flatness becomes not more than about ⅓ when etching is performed in an amount of about 1 µm. The improvement in flatness is not observed any more when etching is performed in an amount of about 2.8 µm. In the case of this experimental example, it is apparent that the work-affected layer can be almost completely removed by etching the SiC substrate by not less than about 2.5 µm.

Incidentally, although in the above-described preferred embodiments and experimental examples, the work-affected layer was completely removed by the reactive ion etching process, it is also possible to remove only a portion thereof by the reactive ion etching process and to remove the remainder by chemical mechanical polishing.

The step of removing a work-affected layer by reactive ion etching, the step of mechanical flattening and the step of mirror polishing may be performed for one surface or both surfaces of the SiC substrate in orders other than those shown in the above-described preferred embodiments. By removing a work-affected layer without changing the surface roughness of a worked surface, it is possible to control various types of processing in the method of manufacturing a SiC substrate by polishing.

Thus, according to preferred embodiments of the present invention, a work-affected layer formed on a SiC substrate can be easily removed at a practical etching rate. Therefore, a flat SiC substrate can be easily manufactured. Furthermore, because a work-affected layer can be removed with scarcely any change in the surface roughness of a worked surface, it is also possible to manufacture a substrate in which only one surface is mirror finished. It is possible to use an obtained SiC substrate in a preferable manner as a substrate for forming semiconductor layers, such as high-quality GaN-base semiconductor layers, SiC semiconductor layers, and as a dummy wafer used in the semiconductor manufacturing process.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A method of manufacturing a SiC substrate comprising the steps of:
    providing a SiC substrate that includes a first principal surface and a second principal surface, the first principal surface having a surface roughness of about 10 nm to about 1 µm and including a work-affected layer that is formed by mechanical flattening or cutting the SiC substrate such that compressive stresses are produced in the work-affected layer of the SiC substrate; and
    removing, by reactive ion etching the first principal surface having the surface roughness of about 10 nm to about 1 µm, at least a portion of the work-affected layer; wherein the first principal surface is not subject to mirror polishing before the removing step and is opposite to a surface on which an epitaxial layer is to be grown.

2. The method of manufacturing a SiC substrate according to claim 1, wherein the method further includes a step of cutting the SiC substrate from an ingot of SiC and the first principal surface and second principal surface are formed by the step of cutting.

3. The method of manufacturing a SiC substrate according to claim 1, wherein in the step removing, the SiC substrate is held so as to allow a change in the warp of the SiC substrate.

4. The method of manufacturing a SiC substrate according to claim 1, wherein in the removing step, the work-affected layer is substantially uniformly removed from the first principal surface.

5. The method of manufacturing a SiC substrate according to claim 1, wherein the first principal surface has a surface roughness of about 10 nm to about 1 µm after the step of removing.

6. The method of manufacturing a SiC substrate according to claim 1, wherein the first principal surface is not subject to mirror polishing after the removing step.

7. The method of manufacturing a SiC substrate according to claim 1, wherein the providing step further comprises the step of mirror polishing the second principal surface of the SiC substrate; and before the mirror polishing step, the second principal surface of the SiC substrate has a surface roughness of about 10 nm to about 1 μm.

8. The method of manufacturing a SiC substrate according to claim 1, wherein the surface roughness of the first principal surface after the removing step is substantially the same as the surface roughness of the first principal surface before the removing step.

9. The method of manufacturing a SiC substrate according to claim 1, wherein the first principal surface is not subject to wet etching before the removing step.

10. The method of manufacturing a SiC substrate according to claim 1, wherein the first principal surface is opposite to a surface on which an element is to be formed.

11. The method of manufacturing a SiC substrate according to claim 1, wherein a warp of the SiC substrate is changed by the removing step.

12. The method of manufacturing a SiC substrate according to claim 1, wherein a warp of the SiC substrate is substantially eliminated by the removing step.

13. The method of manufacturing a SiC substrate according to claim 1, wherein the removing step removes the whole of the work-affected layer.

14. The method of manufacturing a SiC substrate according to claim 1, wherein the first principal surface is a back surface of the SiC substrate.

15. The method of manufacturing a SiC substrate according to claim 1, wherein the reactive ion etching is performed using a gas containing at least one selected from the group consisting of $F_2$, $CF_4$, $CHF_3$, $CH_2F_2$, $CH_3F$, and $SF_6$.

16. The method of manufacturing a SiC substrate according to claim 15, wherein the gas contains $CF_4$ or $SF_6$.

17. The method of manufacturing a SiC substrate according to claim 15, wherein the SiC substrate is a single crystal; and in the reactive ion etching process, the work-affected layer is removed at an etching rate in a range of about 0.5 μm/hr to about 20 μm/hr.

18. The method of manufacturing a SiC substrate according to claim 15, wherein the SiC substrate is one of amorphous, a poly crystal and a single crystal.

* * * * *